United States Patent
Stancel et al.

(10) Patent No.: US 8,471,141 B2
(45) Date of Patent: Jun. 25, 2013

(54) STRUCTURES FOR LOW COST, RELIABLE SOLAR ROOFING

(75) Inventors: Robert Stancel, Los Altos Hills, CA (US); Martin R. Roscheisen, San Francisco, CA (US); Brian M. Sager, Menlo Park, CA (US); Paul M. Adriani, Palo Alto, CA (US)

(73) Assignee: Nanosolar, Inc, San Jose, CA (US)

( * ) Notice: Subject to any disclaimer, the term of this patent is extended or adjusted under 35 U.S.C. 154(b) by 620 days.

(21) Appl. No.: 12/116,932

(22) Filed: May 7, 2008

(65) Prior Publication Data

US 2008/0302030 A1     Dec. 11, 2008

Related U.S. Application Data

(60) Provisional application No. 60/916,551, filed on May 7, 2007.

(51) Int. Cl.
*H01L 31/042* (2006.01)
(52) U.S. Cl.
USPC .......................................... 136/246; 136/259
(58) Field of Classification Search
USPC ....................................................... 136/246
See application file for complete search history.

(56) References Cited

U.S. PATENT DOCUMENTS

| | | | |
|---|---|---|---|
| 4,193,081 A | 3/1980 | Frank et al. | |
| 5,008,062 A | 4/1991 | Anderson et al. | |
| 5,112,408 A * | 5/1992 | Melchior | 136/251 |
| 5,338,369 A | 8/1994 | Rawlings | |
| 5,743,970 A | 4/1998 | Czubatjy et al. | |
| 6,453,629 B1 * | 9/2002 | Nakazima et al. | 52/173.3 |
| 7,728,219 B2 | 6/2010 | Corrales | |
| 2003/0131973 A1 | 7/2003 | Nair et al. | |
| 2003/0221814 A1 | 12/2003 | Kamath et al. | |
| 2004/0031518 A1 * | 2/2004 | Plantfeber | 136/251 |
| 2005/0133082 A1 * | 6/2005 | Konold et al. | 136/246 |
| 2005/0161074 A1 * | 7/2005 | Garvison et al. | 136/246 |
| 2005/0217716 A1 * | 10/2005 | Masuda et al. | 136/244 |
| 2006/0196128 A1 * | 9/2006 | Duke | 52/173.3 |
| 2008/0000512 A1 * | 1/2008 | Flaherty et al. | 136/244 |
| 2008/0134497 A1 | 6/2008 | Corrales et al. | |
| 2008/0135085 A1 | 6/2008 | Corrales et al. | |
| 2008/0135086 A1 | 6/2008 | Corrales | |

(Continued)

FOREIGN PATENT DOCUMENTS

| EP | 0654819 A | 5/1995 |
|---|---|---|
| EP | 0877427 A | 11/1998 |

(Continued)

OTHER PUBLICATIONS

Hori Harumi, JP 2000-133832 English machine translation, May 12, 2000, 1-5.*

(Continued)

*Primary Examiner* — Jennifer Michener
*Assistant Examiner* — Miriam Berdichevsky
(74) *Attorney, Agent, or Firm* — Joshua D. Isenberg; JDI Patent

(57) ABSTRACT

Improved photovoltaic devices, and more specifically, improved building integrated photovoltaic devices are described herein. In one embodiment, the photovoltaic roofing structure may be comprised of a roofing tile having a top surface, a bottom surface, and a recessed portion; a photovoltaic module sized to fit within the recessed portion of the roofing structure.

16 Claims, 13 Drawing Sheets

U.S. PATENT DOCUMENTS

| | | |
|---|---|---|
| 2008/0135088 A1 | 6/2008 | Corrales |
| 2008/0135090 A1 | 6/2008 | Corrales |
| 2008/0135092 A1 | 6/2008 | Corrales |
| 2008/0135094 A1 | 6/2008 | Corrales |
| 2011/0240098 A1 | 10/2011 | Corrales et al. |
| 2011/0297361 A1 | 12/2011 | Carbone et al. |

FOREIGN PATENT DOCUMENTS

| | | |
|---|---|---|
| JP | 9252066 A | 9/1997 |
| JP | 11036540 A | 2/1999 |
| JP | 2000133832 A | 5/2000 |
| KR | 20020013982 A | 2/2002 |
| KR | 100867655 B1 | 11/2008 |
| KR | 20100007240 A | 1/2010 |
| WO | 2008073905 A2 | 6/2008 |
| WO | 2008073908 A2 | 6/2008 |
| WO | 2010118183 A2 | 10/2010 |
| WO | 2011116035 A2 | 9/2011 |

OTHER PUBLICATIONS

International Search Report dated Apr. 8, 2010 for PCT Application No. PCT/US2007/087007.

International Search Report dated Jun. 14, 2010 for PCT Application PCT/US20071087010.

International Search Report dated Oct. 28, 2011 for PCT Application No. PCT/US2011/028577.

International Search Report dated Oct. 29, 2010 for PCT Application No. PCT/US2010/030307.

U.S. Appl. No. 60/964,695, filed Aug. 9, 2007 titled Cost Effective Heat Exchanger for Solar Panels and Roof Titles.

* cited by examiner

STRUCTURES FOR LOW COST, RELIABLE SOLAR ROOFING

CROSS-REFERENCE TO RELATED APPLICATION

This application claims priority to U.S. Provisional Application Ser. No. 60/916,551 filed May 7, 2007 and fully incorporated herein by reference for all purposes.

FIELD OF THE INVENTION

This invention relates generally to photovoltaic devices, and more specifically, to improved building integrated photovoltaic devices.

BACKGROUND OF THE INVENTION

Building integrated photovoltaic (BIPV) roof tiles currently represent a small portion of the overall photovoltaic market, in spite of the seemingly compelling proposition of integrating an energy source into a roofing component. Market adoption has been slow due in part to the relatively high cost of roofing tiles integrated with PV modules. High cost is currently incurred since solar modules are not designed to serve as a bulk construction material, but rather integrated into a home as a custom electrical installation. There are several barriers within the current residential rooftop BIPV market that have kept the overall market small and limited product adoption.

One of these barriers comprises of costly manufacturing processes whereby relatively expensive silicon wafers are interconnected with the often mismatched framework of a roofing tile. The solar cells are inherently costly, and their interconnection process takes time and incurs additional cost, increasing the total system cost.

Conventional BIPV roofing tile product has substantial dead space where the wafers do not fully occupy the area within the tile frame (the "open area"). This spatial inefficiency reduces the power density of the roofing tile, and requires additional tiles to be installed to achieve a particular power output for a given solar system.

Additionally, time-consuming installation processes for BIPV products such as roofing tiles, including extensive electrical wiring and mechanical interconnection between tiles, results in high system installation costs and makes operations and maintenance of installed systems cost prohibitive.

Solar modules are currently larger than typical roof tiles. The inconsistency in size and shape creates substantial integration issues.

Installation of shingles and tiles is currently performed by roofers. Installation of solar panels with these shingles and tiles, however, requires the additional involvement of an electrician on the roof, further increasing system installation cost.

While roofing has as one of its purposes the provision of thermal insulation, solar cells desire proper ventilation to keep them cool for better electrical efficiency, contradicting the thermal insulation requirement of the tile. At higher temperatures, roofing tiles incorporating PV modules perform less effectively, reducing their levelized cost of energy (LCOE).

Lack of tenability of current levels for a given module area is also an issue. Conventional silicon wafers are formed with standardized sizes, and cannot be cut to a particular size after formation. As cell photocurrent is proportional to cell area, it is not possible to tune photocurrent when the cell area is fixed.

Conventional silicon-based PV modules integrated with roofing tiles suffer from materials incompatibilities that degrade their product performance; mismatches in coefficients of thermal expansion (CTE) create stresses and strains that damage module integrity over time and with environmental exposure. Further, for those BIPV roofing tile products that incorporate plastic frameworks, the use of plastic materials exposes these modules to substantial attach upon UV exposure, and most organic materials degrade with extended sun exposure.

Drawbacks associated with traditional photovoltaic solar tiles have limited the ability and financial rationale to install large numbers of BIPV roofing in a cost-effective manner. These traditional solar tile configurations are also constrained by conventional design methodology that limit the modules to certain materials and inherit a large number of legacy parts. This combination of high material cost and conventional design hamper the ability of installers to rapidly and cost-efficiently deploy solar roofing at a large scale.

Although subsidies and incentives have created some large solar-based electric power installations, the potential for greater numbers of these large solar-based electric power installations has not been fully realized. There remains substantial improvement that can be made in BIPV roofing that can greatly reduce their cost of manufacturing, increase their ease of installation, and create much greater market penetration and commercial adoption of such products, particularly for residential installations.

SUMMARY OF THE INVENTION

Embodiments of the present invention address at least some of the drawbacks set forth above. The present invention provides for the improved BIPV roofing tile design that simplifies the configuration and reduces the materials costs associated with such photovoltaic roofing elements. Although not limited to following, these improved roofing element designs are well suited for installation at dedicated sites where redundant elements can be eliminated where some common elements or features may be shared by many modules. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. At least some of these and other objectives described herein will be met by various embodiments of the present invention.

In one embodiment of the present invention, a key feature of the new design, requiring significant development, is a cost-effective, intuitive, simple, secure, and optionally UL-approved electrical connection between tiles. If the tiles are small, the relative cost of electrical connectors in the overall solar installation is significant, requiring a low cost connector. This connector should automatically create an electrical contact when two neighboring solar tiles are installed next to each other. The contact will give affirmative feedback (visual, auditory, tactile, or the like) when the connection is made properly, enabling tile-to-tile installation by non-electricians. Additional technical specifications are mechanical robustness, corrosion resistance, reliable electrical connection, and the need to be safe to the touch during installation. Cabling is reduced to the ends of each tile row, and together with the elimination of a junction box, this can be the lowest cost BIPV tile on the market.

Large scale solar panels distribute the cost of one set of electrical connectors and mounting over a larger quantity of cells. This has led to solar module sizes that, optimized for commercial rooftops and green field installations, are significantly larger than a standard roof tile format, which over decades has been fine-tuned for optimum balance between installation effort and flexibility. As multi-faceted residential roofs have gables, chimneys and partial shading, which all restrict the area where solar modules can be mounted, a smaller form factor is desirable to maximize the flexibility. The foil substrate can be cut into a wide range of cell formats, increasing the format options to fit into a single tile.

As the solar tiles replace the existing conventional roof tiles and mount onto the existing roof battens, no additional on-roof mounting infrastructure is required. Given the ease of use, the same roofers that install regular tiles can install the solar roof tiles, as the installation follows the same rules, on the same level of care. Additional installation cost is limited to an electrician connecting the start and end tiles of a row to the inverter or to each other. Sales and distribution channels are equivalent to existing roofing product channels.

With the mounting costs being equivalent to that of conventional roof tiles, and production of the carrier for the solar inlay following the same mass manufacturing methods, the surrounding mechanical infrastructure is equivalent to existing roofing. Only the electrical infrastructure and the solar cell inlays, utilizing the lowest-cost cells in the industry, are additional costs, making grid parity for building-integrated solar power possible.

While the appearance of most solar roof modules stands in stark contrast with the surrounding roof surface, the solar tiles use frames of the material, color and texture identical to that of the surrounding tiles. The solar inlays have no frame, visible electrical contacts or mounting hardware. Shape and style match the conventional tile, and given the flexible cell substrate, an arced glass top on the solar insert is possible to harmonically 'weave' solar inlays into S-shaped tiles. A uniform layout of grids and rows of solar tiles becomes feasible on a roof by offering matching dummy cells that look like solar tiles for shaded areas. The juxtaposition of the traditional material and solar glass inserts creates an aesthetic tension that does not try to hide the solar panels, but frames them into a bold statement.

The temperature characteristics of solar cells desire that the cells remain relatively cool, while roofing needs to provide thermal insulation and water protection. The foil substrate cells allow mounting them on a thin metal back foil, enabling effective back ventilation. In addition, the tile itself contains air channels that provide back ventilation of the tile, while inhibiting water penetration.

Although not limited to the following, foil substrate cells of the present invention are flexible in size and ratio and thus the surface area of the inlays can almost completely be covered by active cells for all existing conventional tile geometries. In comparison with silicon wafer cells that in most roof tile sized modules might only fill part of the available area, similar overall efficiency can therefore be achieved at substantially lower per watt cost. The output current of the tile can be tuned for optimal system efficiency by varying cell size in a range from 1 A to approximately 10 A, with the system voltage being decided by the amount of tiles in series.

Embodiments of the present invention may overcome the drawbacks of conventional devices by incorporating CIGS cells printed onto foil substrates and rapidly interconnecting the cells using a proprietary high-throughput assembly process. Inlay modules may be assembled as glass-foil laminates and inlaid into carrier frames that have been co-developed for a precise fit, yielding rapid carrier/inlay integration. The carrier frame material may be selected for environmental resistance and both low materials and low manufacturing costs. Success with this technology improvement opportunity may impact the Key Performance Parameters (KPPs) of Direct Manufacturing Cost, Annual Manufacturing Capacity, and Levelized Cost of Energy (LCOE).

Embodiments of the present invention may overcome the drawbacks of conventional devices by sizing and cutting cells to the exact dimensions of the inlay area within the carrier frame, resulting in nearly 100% inlay coverage. Optionally, some embodiments may use sizes that provide at least 95% inlay coverage. Optionally, some embodiments may use sizes that provide at least 90% inlay coverage. Balancing the inlay size with the aesthetic requirements of the residential rooftop market, this may maximize power density in a given rooftop installation. Success with this technology improvement opportunity may impact the KPP of Power Density.

Embodiments of the present invention may overcome the drawbacks of conventional devices by developing a streamlined electrical and mechanical installation process that may facilitate rapid and low-cost plug and play PV tile installation. Success with this technology improvement opportunity may impact the KPP of LCOE.

Embodiments of the present invention may overcome the drawbacks of conventional devices by manufacturing an electrically and mechanically integrated roofing product that can be assembled with minimal installation time and minimizes the involvement of specialized electrical contractors. An assembly process is provided in which an electrician only needs to connect complete rows of tiles on the roof, not install each of them separately. Success with this technology improvement opportunity will impact the KPP of LCOE.

Embodiments of the present invention may overcome the drawbacks of conventional devices by designing and manufacturing streamlined ventilation channels within the carrier component of the BIPV tiles, resulting in inherently higher air flow and lowering the normal operating cell temperature (NOCT) to provide for optimum power conversion efficiency. Success with this technology improvement opportunity will impact the KPP of Normal Operating Cell Temperature (NOCT).

Embodiments of the present invention may overcome the drawbacks of conventional devices by tuning the area of each PV cell within the BIPV module to the area that provides for a target photocurrent output, allowing for a match to the current requirement of a target application within the residential rooftop market. Success with this technology improvement opportunity may impact the KPP of Current Tunability.

Embodiments of the present invention may overcome the drawbacks of conventional devices by using glass as a PV module encapsulant and an similarly environmentally-resistant carrier material as the primary materials protecting the aggregate device; both materials may need to be durable on the scale of decades (Akbari et al., 2005a,b). The impact of CTE mismatches may be minimized by appropriate design of spacing between material surfaces and interfaces to allow for the expansion and contraction of particular materials. Success with this technology improvement opportunity may impact the KPP of Mean Time Between Failures (MTBF).

In one embodiment of the present invention, a photovoltaic roofing structure is provided comprising of a roofing tile having a top surface, a bottom surface, and a recessed portion. A photovoltaic module may be sized to fit within the recessed portion of the tile. Optionally, instead of a tile, other rigid roofing material may be used. Optionally, in other embodiments, instead of a roof, the module is integrated with other non-roof building material.

By way of nonlimiting example, any of the embodiment herein may be adapted to include the following features. In one embodiment, the photovoltaic roofing structure is configured so that a ratio of the weight of the tile to the weight of the module is greater than 10:1, wherein the combination of the module and tile weighs less than a conventional roofing tile of the external volume and surface area. Optionally, the tile comprises of ceramic. Optionally, the tile includes an air circulation pathway between a bottom surface of the module and the tile surface in the recess. Optionally, electrical leads from the module exit from between the module layers without passing through a central junction box. Optionally, electrical leads from the module exit through hole(s) in the module layer, without passing through a central junction box. Optionally, the module is a glass-glass module. Optionally, the module is a glass-foil module. Optionally, the module is a flexible barrier-polycarbonate module. Optionally, the module is a transparent flexible barrier-glass module. Optionally, the module is a glass-flexible back layer module. Optionally, the module contains thin-film solar cells. Optionally, the module contains solar cells based on a group IB-IIIA-VIA absorber layer. Optionally, the module contains solar cells based on other, non-CIGS thin-film absorber layer. Optionally, a polymer material is between the tile and the module to minimize changes due to thermal or other issues. Optionally, a coupler is used to manage CTE differences between the module and the tile. Optionally, the tile defines an opening passing entirely through the tile, over which the module is placed. Optionally, the tile defines a carrier frame with an open center that is covered by the photovoltaic module. Optionally, a ventilation channel is provided to dissipate heat from beneath the module. Optionally, a ventilation channel is defined between a bottom surface of the module and a portion of the surface of the tile. Optionally, a ventilation channel is configured to dissipate heat from beneath the module. Optionally, the structure may include a press-fit electrical connector to create serial interconnection between tiles. Optionally, the surface area of the module can almost be completely be covered by active cells. Optionally, the tile is curved and the module is curved to match a curved surface of the tile. Optionally, the module comprises of a plurality of solar cells between a non-rigid module top layer and a rigid module bottom layer.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a device optionally contains a feature for an anti-reflective film, this means that the anti-reflective film feature may or may not be present, and, thus, the description includes both structures wherein a device possesses the anti-reflective film feature and structures wherein the anti-reflective film feature is not present.

Photovoltaic Roofing Element

Figure 1:
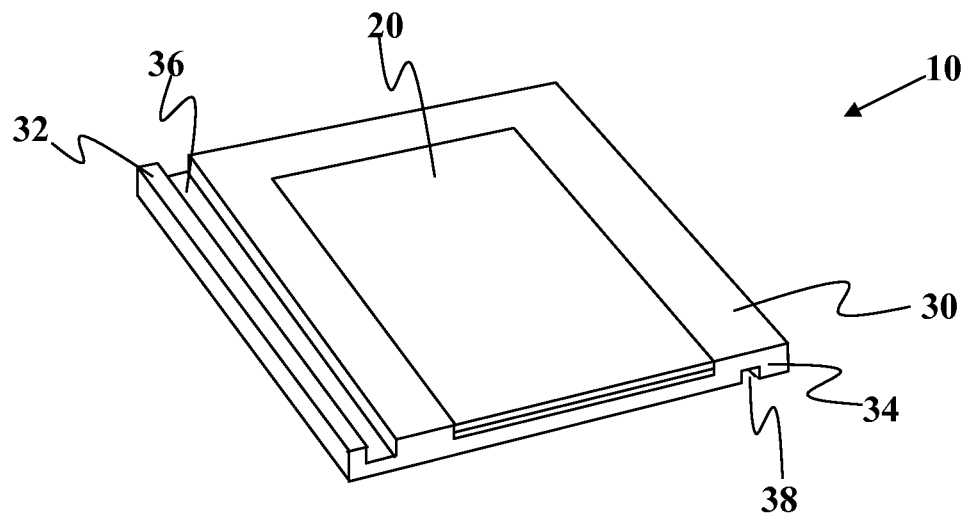
FIG. 1 is a perspective view of a photovoltaic roofing element according to one embodiment of the present invention.

Referring now to FIG. 1, one embodiment of a photovoltaic roofing element 10 will now be described. Although the present invention is described in the context of ceramic or slate roofing tiles, it should be understood that the present invention is applicable to various other types of roofing elements.

As seen in FIG. 1, the photovoltaic module 20 is housed in a recess or opening formed in the tile portion 30 of the photovoltaic roofing element 10. The tile portion 30 remains the main structural element of the photovoltaic roofing element 10. In the present embodiment, the photovoltaic module 20 is an inlay element that is supported by the tile 30. The tile 30 comprises of typical materials used for roofing tiles. This includes but is not limited to clay, ceramic, concrete, copper, steel, stainless steel, aluminum, iron, stone, glass, marble, fiberglass, granite, porcelain, or the like. The tile 30 may be glazed or otherwise surface treated to improve the durability, heat transfer properties, visual appearance, increase stain resistance, reduce efflorescence, increase or reduce surface smoothness, or the like. Although not limited to the following, the tile 30 may include matching tongues 32, 34 and grooves 36, 38 on the edges of the tiles to facilitate placement and connection with adjacent tiles (solar or non-solar).

As seen in FIG. 1, the upper surface of tile 30 remains visible even with the photovoltaic module 20 inlaid in the tile 30. The tile 30 retains its functionality as a roofing tile. Although not limited to the following, the tile 30 has an exterior outline shaped like the other non-photovoltaic tiles used on the roof and the installers are comfortable handling in a manner similar to other roofing tiles. By way of nonlimiting example, the tile 30 may be comprised of the same material as the other non-photovoltaic tile. This allows the tile 30 to blend visually with other non-photovoltaic tiles as they comprise of substantially the same material. Again not limited to the following, the Advantageously in one embodiment of the present invention, the ratio of the weight of the module to the weight of the tile may be equal to, less than, or more than that of the tile. The overall weight of the combination is less than that of a roofing tile of the same size but providing coverage without the photovoltaic module. Optionally, the overall weight is less than that of a roofing tile of the same size made of a Class A fire rated material but providing roofing coverage without the photovoltaic module. In one embodiment, the ratio of the weight of the tile to the weight of the photovoltaic module is in the range of about 3:1 to 1:1. In one embodiment, the ratio of the weight of the tile to the module is in the range of about 5:1 to 1:1. In another embodiment, the range is about 10:1 to 1:1. This ratio allows for the photovoltaic module to contribute relatively less to the overall weight of the combined BIPV tile. The tile remains first and foremost a Class A fire-rated material. Even if the in-laid solar module is itself damaged in some way, the present embodiment of tile 30 will continue to retain is inherent weatherproofing and fireproofing capability. In this manner, the bulk of the weight still comes from the tile material itself and not from the module.

Figure 2:
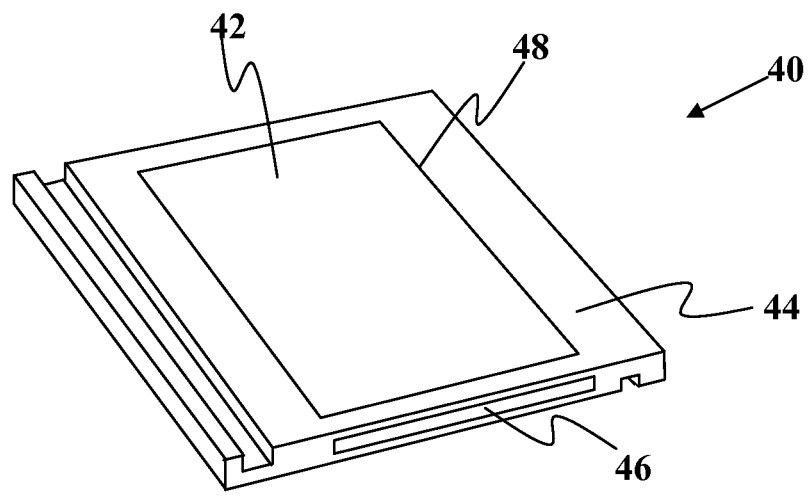
FIG. 2 is a perspective view of a photovoltaic roofing element according to another embodiment of the present invention.

Referring now to FIG. 2, yet another embodiment of the present invention will now be described. FIG. 2 shows a photovoltaic roofing element 40 comprised of a photovoltaic module 42 and a roofing tile 44. This photovoltaic roofing element 40 differs from photovoltaic roofing element 10 in that the photovoltaic module 42 slides through a slot 46 into a channel defined within the tile 44. This slot 46 allows for increased mechanical overlap to hold the photovoltaic module 42 in the tile due to overhang created by having a portion of the tile 44. This may be created by having the opening 48 above the module 42 that exposes the module to the sunlight be smaller than the overall dimensions of the module.

It should be understood that after the module is inserted into the tile 44, the slot 46 may be filled or sealed with material to close the slot 46. In some embodiments, only enough material is provided to prevent the module from sliding out of the tile 44, without actually completely sealing the slot 46. In alternative embodiments, a mechanical stopper, mechanical attachment, or other device such as a set screw may be used to secure the tile in position.

Optionally, in some embodiments, there is no slot 46. The module 42 is integrally molded with the tile during tile fabrication and there is no need for a slot to insert the module 42 at a later time. Although not limited to the following, the module may be loosely held therein to allow for coefficient of thermal expansion (CTE) differences.

Heat Dissipation

Figure 3:
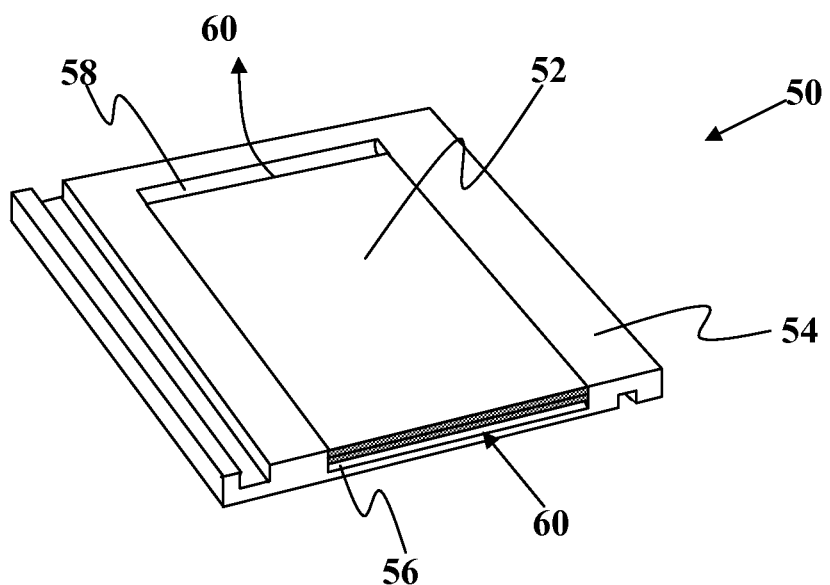
FIG. 3 is a perspective view of a photovoltaic roofing element according to another embodiment of the present invention.

Referring now to FIG. 3, a still further embodiment of the present invention will now be described. The photovoltaic roofing element 50 is designed to address thermal issues associated with putting a photovoltaic module 52 in a roof shingle or tile 54. Although increased sunlight intensity usually means increased electrical output from solar device, increasing sunlight intensity also usually means increased normal operating cell temperature (NOCT) of the solar cell. For solar cells and solar cell modules, excessive heat decreases the conversion efficiency of these devices. NOCT for most solar cell modules is around 47° C. Many solar cell modules lose about 0.5% efficiency for every degree of increase in NOCT. A variety of factors may contribute to increased NOCT such as greater ambient air temperature during the day, increased temperature of the solar module itself from extended sun exposure, or radiant heat from ground surfaces and other nearby surfaces which may emit heat generated from sun exposure.

This thermal issue may be of particular concern for BIPV devices. Most conventional solar modules are ground mounted or roof mounted in a manner sufficiently spaced above the ground or roof surface such that the underside of the module is not in such close proximity to a thermal mass. This distance allows for decreased operating temperature as various factors such as wind and distance from radiant heat sources allow the modules to be at a lower temperature. With a building integrated photovoltaic material, the design constraints are such that the module is necessarily in relatively close proximity to a radiant heat source or thermal mass such as the tile itself.

FIG. 3 shows one technique for addressing the increased heat dissipation needs. FIG. 3 shows an embodiment of a photovoltaic roofing member 50 with a photovoltaic module 52 integrated with a shingle or tile 54. The module 52 is positioned such that a channel or void space is defined between the bottom surface of the module 52 and the tile 54. Openings 56 and 58 allow air to flow as indicated by arrows 60 (bottom up). Optionally, the air may flow in reverse (top down) depending on the direction of the wind.

Figure 4:
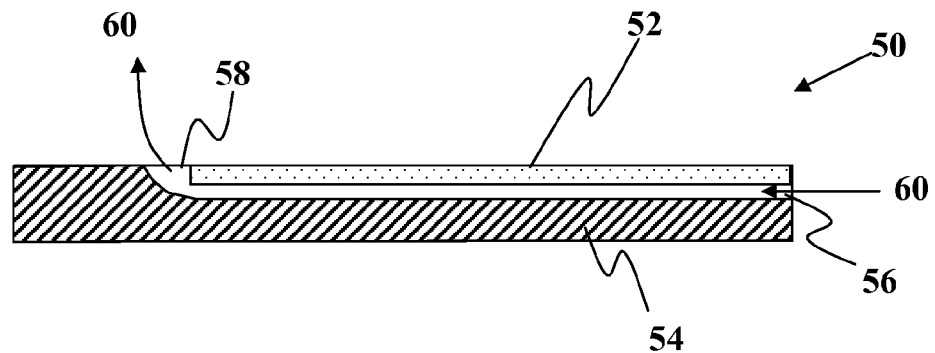
FIGS. 4 and 5 show cross-sectional views of photovoltaic roofing elements according to embodiments of the present invention.

FIG. 4 shows a cross-sectional view of the photovoltaic roofing member 50. The channel 62 is defined between the module 52 and a recessed portion of the file 54. The channel 62 allows flow as indicated by arrows 60 which will allows for heat to be carried away from the module and also provide a buffer zone that otherwise not exist if the module were in direct contact with the tile. In some embodiments, the channel may have a height greater than, less than, or equal to the thickness of the module 52. Optionally, the width of the channel may have a width greater than, less than, or equal to the thickness of the solar module 52. Optionally, the openings 56 and 58 may have a height greater than, less than, or equal to the thickness of the module 52. Optionally, the openings 56 and 58 may have a width greater than, less than, or equal to the thickness of the solar module 52. Some embodiments may have more than one channel beneath the module 52 as will be shown in FIG. 10.

To address clearly expressed heat buildup concerns in BIPV systems residential solar market, the design may be balanced between maximum air flow and sufficient water insulation of the tile. In one embodiment, the present invention may comprise of a solar laminate that does not have a glass back, but a thin metal back foil for better heat dissipation. Various surface textures such as dimples and bumps for turbulent flow and corrugation patterns for surface increase will be explored. An air flow channel through the tile will be designed, and the most promising partial designs will be integrated into complete tiles to be tested and iterated on.

Optionally, the back sheet of the solar inlays will be optimized for heat dissipation. This may include but is not limited to a variety of NIR reflective and heat dissipating coatings, colors, textures and corrugation to enlarge the surface area and induce turbulent air flow across the back. A tile geometry may comprise of one that has an air channel across the back of the solar inlay. The first implementation will be a 'dry' air channel, i.e. an air flow channel behind the water protection layer of the tiles. Optionally, should the tests not lead to satisfactory results, a 'wet' air channel will be experimented with, which will have an overall higher air temperature, but could have higher air throughput.

Figure 5:
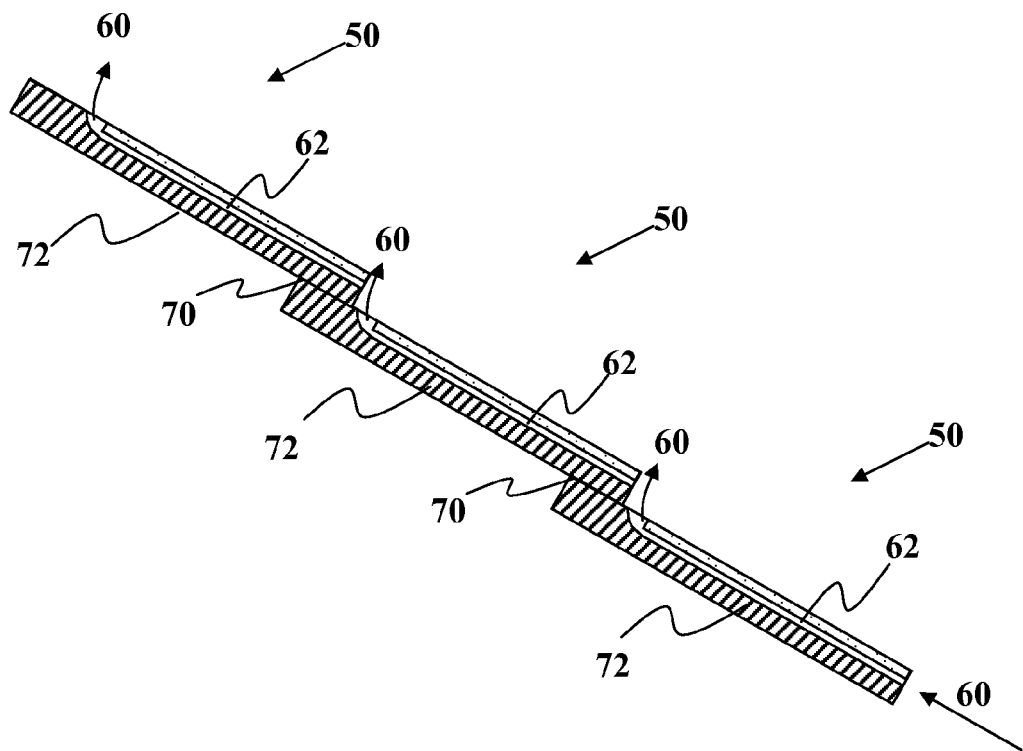

FIG. 5 shows that a plurality of photovoltaic roofing elements 50 may be coupled together as part of the shingle or tiles on a roof. As seen in FIG. 5, the channels 62 in the roofing elements are all located above any seals or connections 70 formed between elements 50. The same can be said for the openings 56 and 58 associated with each channel 62. In this manner, the creation of channels 62 and openings 56 and 58 beneath the modules 52 does not in any way compromise the water barrier or weather-proofing qualities of the tiles 54 because these elements are all formed on upper surfaces of the tile, without creating paths to areas accessing the protected underside 72 of the tiles 54.

Figure 6:
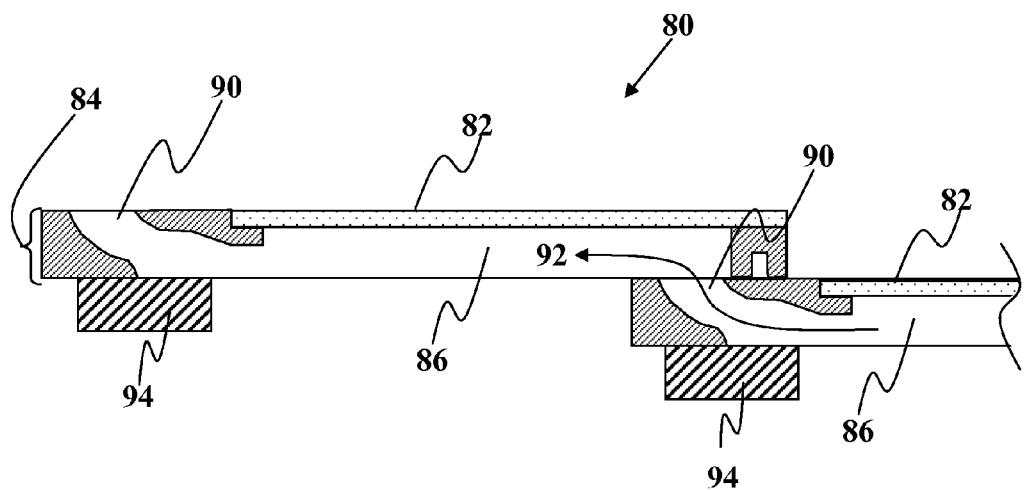
FIGS. 6 and 7 show cross-sectional views of photovoltaic roofing elements according to embodiments of the present invention.

Referring now to FIG. 6, another embodiment of the present invention will now be described. This embodiment shows a variation on the ventilation scheme that may be used to dissipate heat from the roofing elements. In the cross-sectional view of FIG. 6, a photovoltaic roofing element 80 comprises of a photovoltaic module 82 mounted over a shingle or tile 84. This embodiment of the photovoltaic roofing element 80 differs from the embodiment of roofing element 50 in that the eave side edge of the tile 54 is changed. The opening 56 is removed and is either placed on the underside of the tile 84 or the channel or void space 86 opens over the vent 88 on the ridge side of the tile 84. In this manner, one channel from one tile may be positioned to vent into the opening 90 of the channel of an adjacent tile. Air may flow between tiles as indicated by arrow 92. The tiles themselves may be supported by battens 94.

Figure 7:
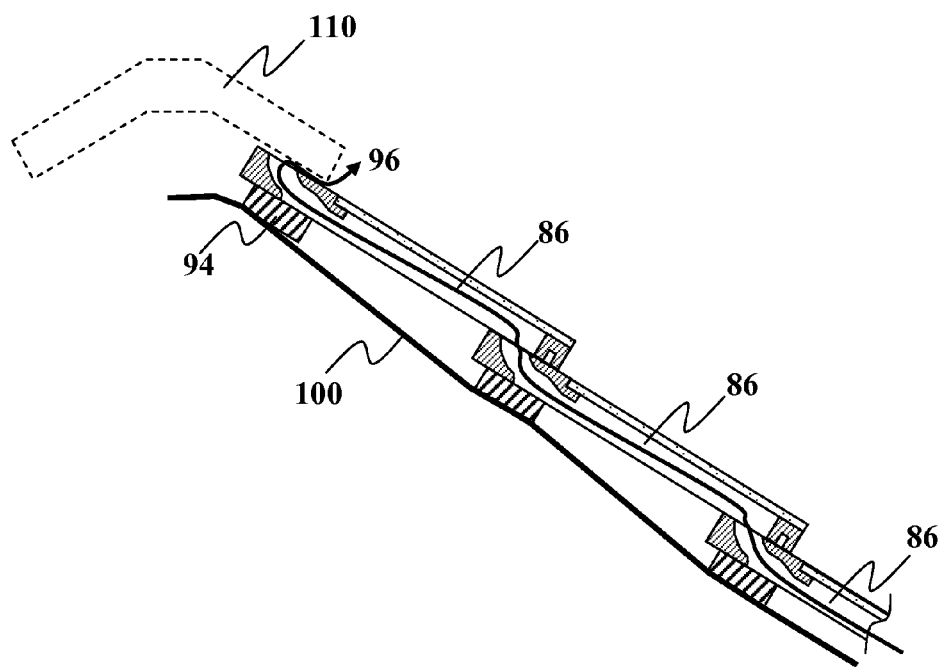

As seen in FIG. 7, this interconnection of channels 86 may reduce the number of entry locations to the underside of the module (e.g. not every tile has an opening leading to the underside) allow for flow beneath the modules for heat dissipation. The air flow as indicated by arrow 96. In most embodiments, the underlayment 100 beneath the roof tiles 84 prevents moisture in the air flowing beneath the module 82 from entering the house structure beneath the underlayment 100. The entry from the top of the tile is controlled by a capping tile 110 at the hip or ridge of the roof to allow for air flow 96 to exit, but prevent water from entering. Air flow coming from the eave side of the tile may be by way of channel 80 that may overhang the gutter or support structure at the eave of the roof.

Figure 8:
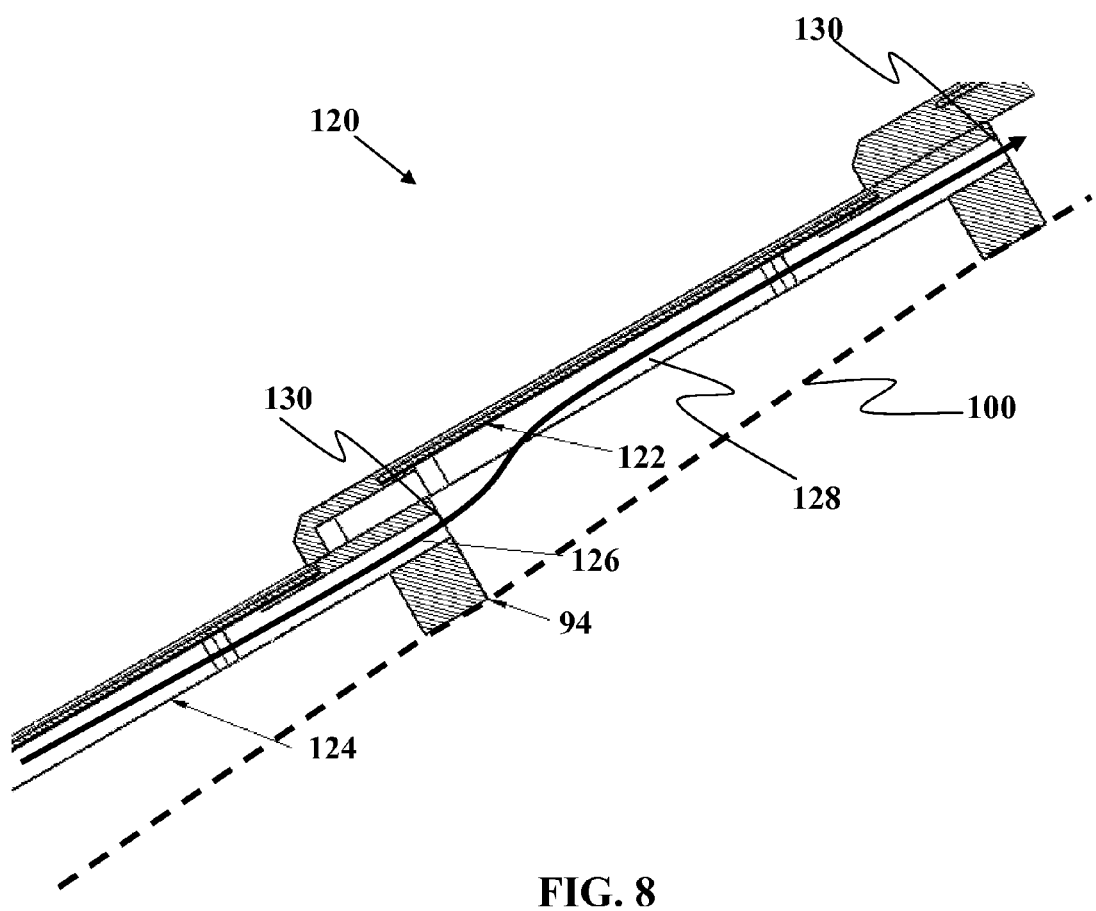
FIG. 8 shows a cross-sectional view of several photovoltaic roofing elements according to one embodiment of the present invention.

FIG. 8 shows a cross-sectional view of yet another embodiment of the present invention with ventilation for heat dissipation. FIG. 8 shows the photovoltaic roofing element 120 with a photovoltaic module 122 and a shingle or tile 124. Air flow between the adjacent tiles is as indicated by arrow 126. The photovoltaic roofing element defines 120 a void space 128 beneath the module 122. The lower bounds of this void space 128 is typically defined by underlying roof structure such as but not limited to the underlayment 100. This photovoltaic roofing element 120 is a simplified structure as it does not have the curved vent structure 90 found in roofing element 80 (see FIG. 6). The present roofing element has an opening or carveout 130 that is located at one end of the tile, typically the top end. Each roofing element 120 is laid down to have its opening or carveout 120 in communication with the hollow underside the adjacent roofing element so that air may flow between them.

Figure 9:
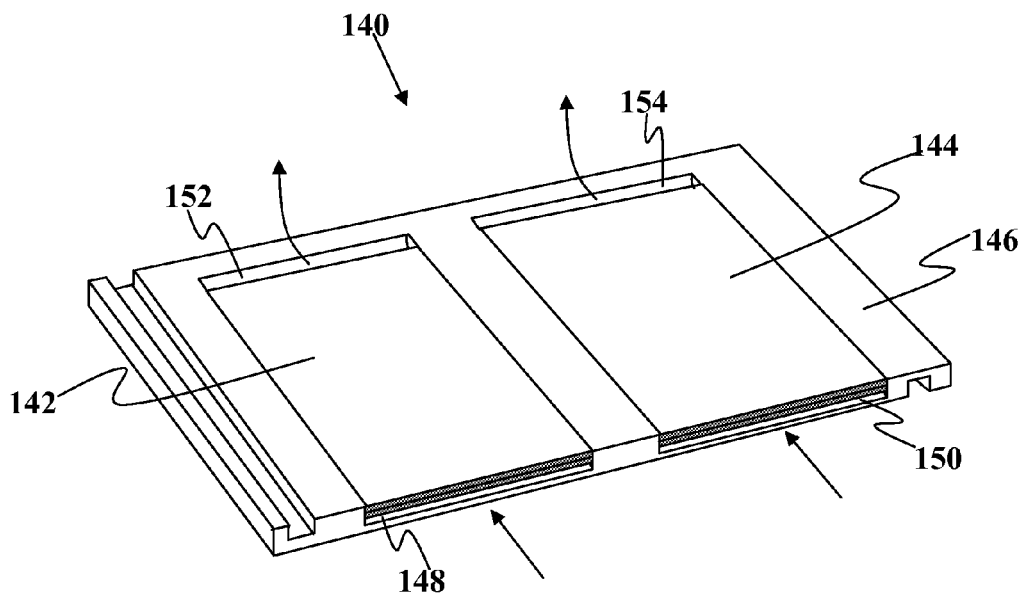
FIG. 9 is a perspective view of a photovoltaic roofing element with two photovoltaic panels according to one embodiment of the present invention.
Figure 10:
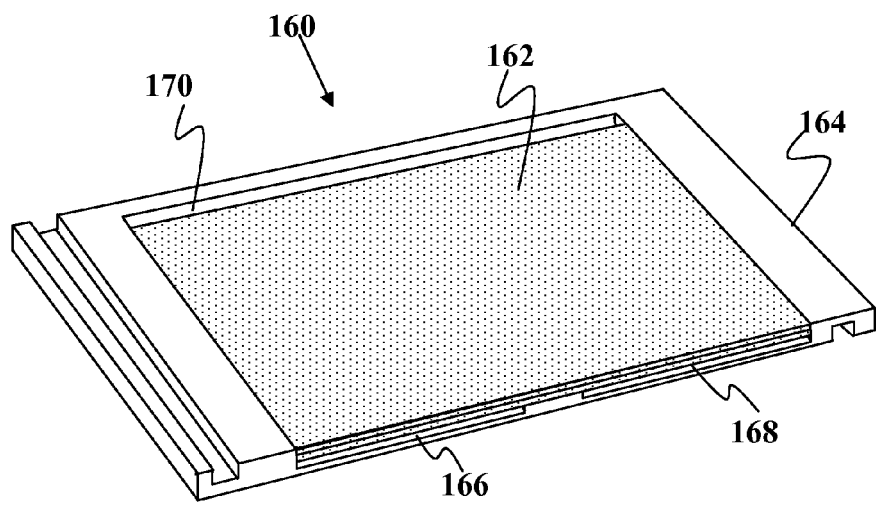
FIG. 10 shows a photovoltaic roofing element with a cooling channel below according to one embodiment of the present invention.

Referring now to FIGS. 9 and 10, it is seen that other embodiments of the present invention may use varying number of ventilations channels and/or openings. FIG. 9 shows a photovoltaic roofing element 140 with more than one photovoltaic module 142, 144 in a tile or shingle 146. In this particular embodiment, the tile 146 has openings 148 and 150 to allow air flow beneath each of the photovoltaic modules 142, 144. This embodiment shows corresponding openings 152 and 154 to let air flow exit from the other end of the tile 146. Of course, it should be understood that other embodiments may have additional openings.

FIG. 10 shows a variation on the embodiment of FIG. 9. The photovoltaic roofing element 160 of FIG. 10 is shown with a single photovoltaic module 162 in the tile 164. The module 162 has more than one opening 166 and 168 for each of module 162. This embodiment shows only one large exit opening 170 corresponding to the two openings 166 and 168. Optionally, in some embodiments there may be the same number of or more openings corresponding to openings 166 and 168.

Non-Flat Tiles

Although most embodiments are shown as flat tiles, it should be understood that tiles or shingles of other shapes may also be adapted for use with the present invention. Some of these shapes include: a) Imbrex and tegula, an ancient Roman pattern of curved and flat tiles that make rain channels on a roof, b) Roman tiles—flat in the middle, with a concave curve at one end at a convex curve at the other, to allow interlocking; c) Pantiles—with an S-shaped profile, allowing adjacent tiles to interlock; these result in a ridged pattern resembling a ploughed field; or d) Mission or barrel tiles—semi-cylindrical tiles made by forming clay around a curved surface, often a log or one's thigh, and laid in alternating columns of convex and concave tiles.

Figure 11:
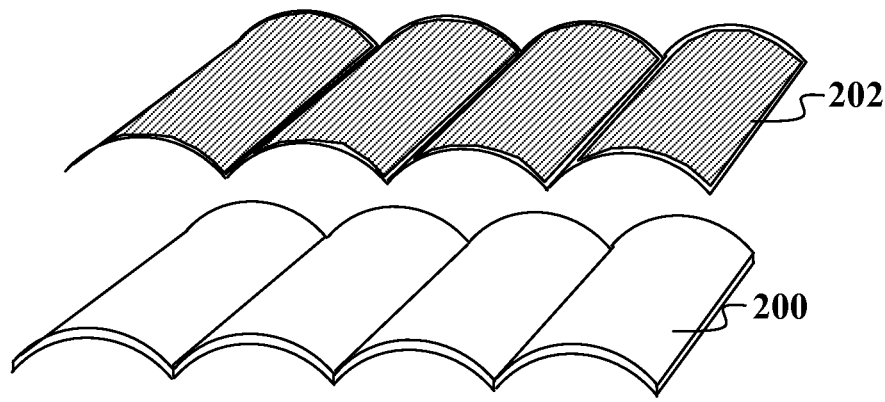
FIGS. 11 and 12 show photovoltaic roofing elements with curved surfaces according to embodiments of the present invention.
Figure 12:
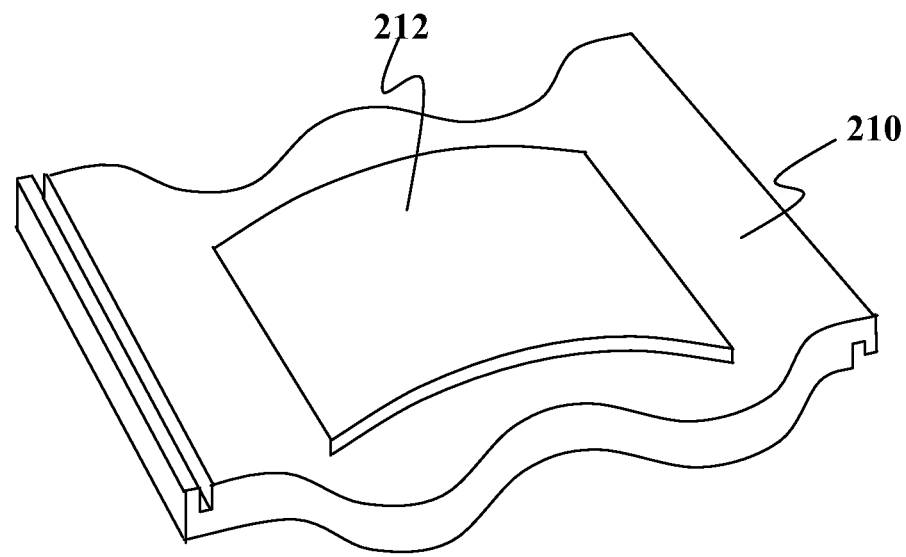

Referring now to FIGS. 11 and 12, some embodiments of the present invention using curved tiles will now be described. FIG. 11 shows a classic mission or barrel curved tile 200 with a matching curved solar module 202 mounted over the tile. The module 202 may be mounted directly on the tile 200 or optionally in a recess formed on the tile to accommodate the photovoltaic module 202. It should be understood that the tile 200 may be adapted to include any of the features previously discussed for flat tiles such as but not limited to the use of recesses to hold the module, ventilation openings, channels, etc. . . . Other features such as the electrical connectivity between modules on adjacent tiles (see FIG. 17-18) may also be used.

FIG. 12 shows yet another embodiment of the present invention where the tile 210 has multiple undulations and has a photovoltaic module 212 mounted over it. As seen here, the module 212 does not exactly mirror the undulations of the tile 210. Instead, the module may be curved (or straight) over the tile in a manner that allows for air flow beneath the module 212. This creates natural separation between the tile surface and the underside of the module 212. It should be understood that the tile 210 may be adapted to include any of the features previously discussed for flat tiles such as but not limited to the use of recesses to hold the module, ventilation openings, channels, etc. . . . Other features such as the electrical connectivity between modules on adjacent tiles (see FIG. 17-18) may also be used.

Figure 13:
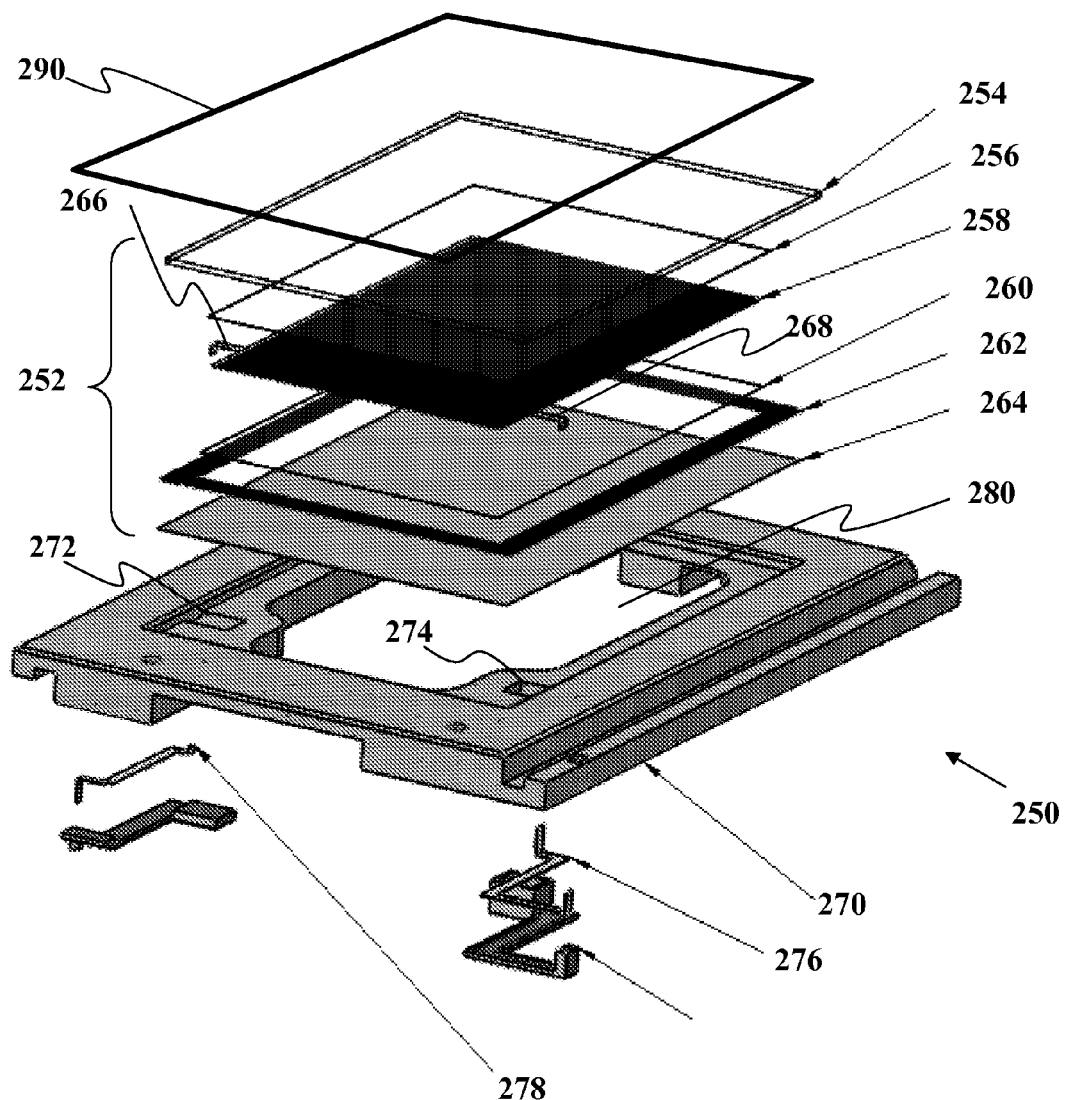
FIG. 13 shows an exploded perspective view of a photovoltaic roofing element according to one embodiment of the present invention.

Referring now to FIG. 13, an exploded perspective view of one embodiment of the present invention will now be described. FIG. 13 shows a photovoltaic roofing element 250 with an integrated photovoltaic module 252. Although the module itself may be comprised of other configuration, this embodiment uses a glass-glass module configuration. In this present embodiment, glass-glass modules include a front glass 254, an encapsulant layer 256, an array of solar cells 258, another encapsulant layer 260, an edge seal 262, and a back panel 264 optionally comprised of another glass layer. Some embodiments may have the cells 258 formed directly on the glass 254 (or optionally on back panel 264). Electrical leads 266 and 268 extend outward from the module 252. The tile 270 has openings 272 and 274 for receiving the leads 266 and 268. Electrical connectors 276 and 278 couple to the leads 266 and 268 from the module. Additional potting material 279 may be included with the leads to secure them to the tile 270.

In the present embodiment, the tile 270 is itself designed with an open or hollow center 280. The open center 280 allows for cooling the underside of the module 252. This design creates a frame-like shape for the tile or carrier frame 270 when the module 252 is removed. A recess is formed in the tile 270 to hold the module 252 in a manner that allows the module to be flush with the upper surface of the tile 270. Although not limited to the following, the inlay shown here will be sized to cover as much of the carrier or tile area as possible. The cells inside the module may be cut and sized to accommodate a range of dimensions, wherein the dimensions may be optimized to minimize cost and maximize power output.

The basic style of tiles developed may be dependent on the market share of the most popular concrete and clay tiles by the largest manufacturers, in order to maximize compatibility with existing roof covers. In one embodiment, this may include but is not limited to a flat tile of up to about 1 inch thickness. The material for the tiles include but are not limited to a range of bulk aggregates such as concrete, as well as recycled plastics, metal, engineered plastic materials, and asphalt derivatives, with durability, solar inlay compatibility, and cost being main evaluation criteria.

The standard attachment mechanisms such as nailing and screwing a tile to the roof battens may be used. Optionally, the attachment mechanisms may use a click-in mounting, barbed hooks, and spring clips. The mechanical interface between tiles is the tested and proven interface of conventional roofing tiles. The interface between the carrier and the solar inlay, however, will be described herein. Configurations are built to be able to compare solar inlays that are fully embedded or are exposed at an edge, create overhangs, are flush or recessed, have wide gaps, or represent different coverage ratios. This embodiment of the present invention and some others herein will withstand the same environmental impact as any standard roof tile, which is this embodiment will not only be tested to solar product standards, but also to building code. UL 790 tests for flammability and fire rating of roof coverings is of relevance. ASTM C 1492 for roofing tiles will be considered in the design. In this context, the discrepancy between solar inlay tolerance and an inhomogeneous bulk material carrier tolerance is of particular relevance, as it creates gaps, which have to withstand freeze-thaw cycles without damage. In addition, the design will consider the transverse strength and other mechanical requirements.

Overall, this embodiment of the present invention is configured to have fire and flammability class C rating and mechanical (cut) stability of the back foil of the inlay are of relevance (UL 1703 for flat-plate PV panels). TÜV SKII safety class 2—1000 V safety rating will not be required for the US with a maximum system voltage of 600V, as will not be DIN 1055, in particular the recently revised and substantially increased −4/−5 wind load and snow load requirements. For the inlay prototypes, ASTM 1171 (test methods for solar modules in cyclic temperature and humidity environments) and ASTM 1830 (test methods for determining mechanical integrity of solar modules) will be considered. Of particular importance is also IEC 60664-1, ensuring proper electrical insulation considering clearance and creepage distances.

To accommodate for differences between the coefficient of thermal expansion between the tile and the photovoltaic module, a polymeric material or adhesive 290 may optionally be used to provide sufficient elasticity to accommodate stresses between the two. Some embodiments may involve using modules that are loosely held in the tile and this looseness allows for sufficient play between the expansion of the module and the tile. In other embodiments, the module may be glued in place and use a polymer based adhesive with sufficient softness to absorb and size mismatch as a result of differences in CTE.

Figure 14:
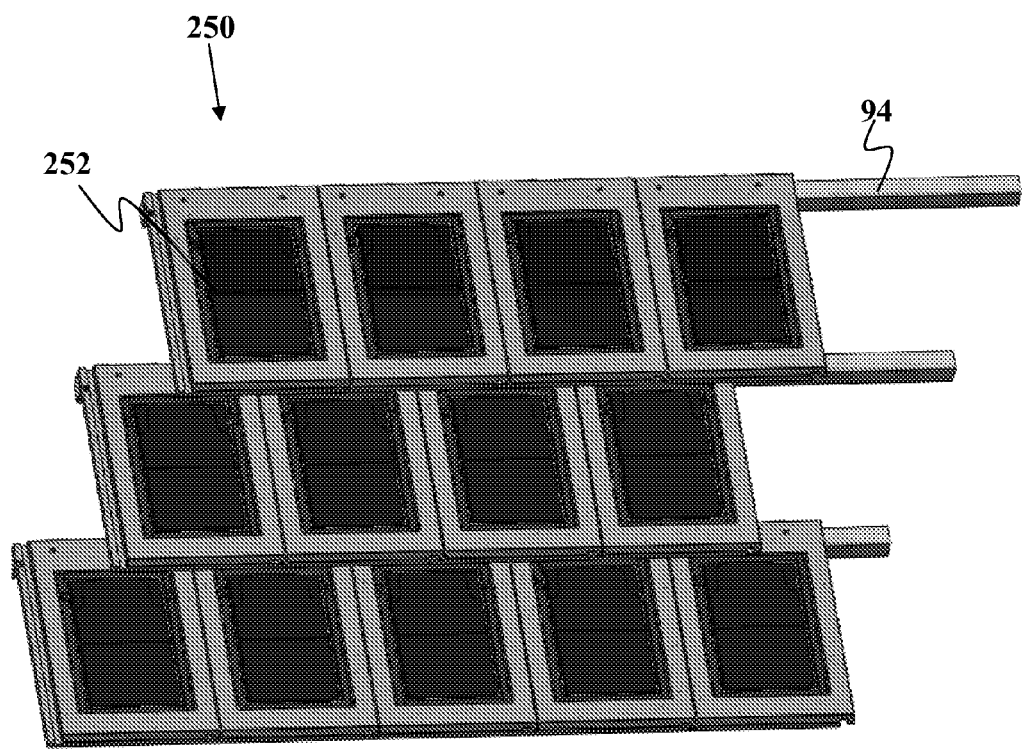
FIG. 14 shows a plurality of photovoltaic roofing elements mounted to a roof supports according to one embodiment of the present invention.

FIG. 14 shows the tiles 270 assembled on a rooftop installation. As seen the position of the tiles are staggered as is typical for roof tile installation. Even with overlap between tiles, substantial amounts of the original tile remains visible, even with the photovoltaic module 252 installed. This allows for improved blending of the photovoltaic roofing elements with the non-photovoltaic tiles to improve aesthetics.

Electrical Interconnects

Figure 15:
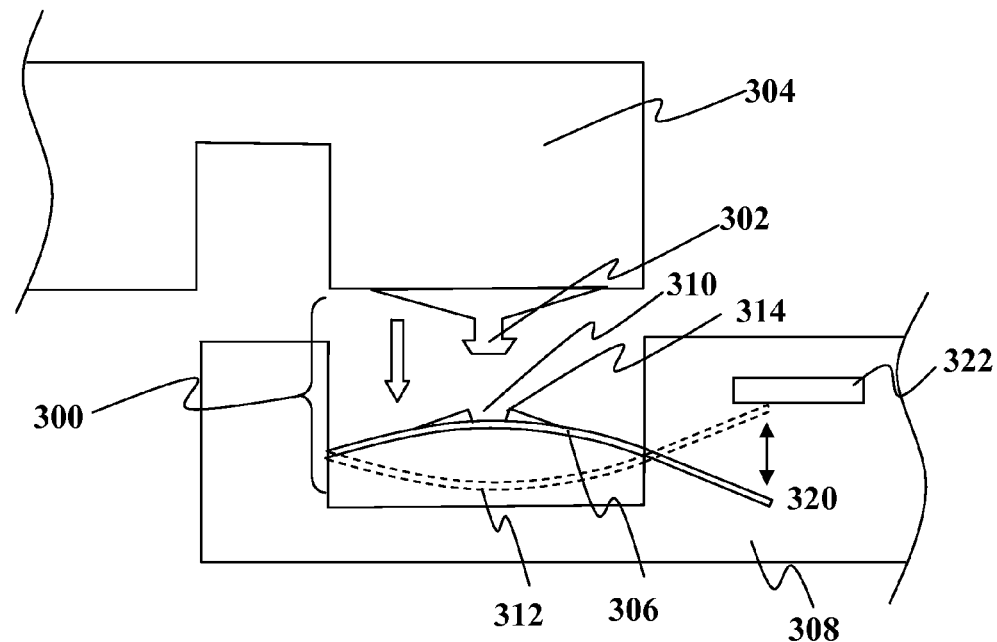
FIGS. 15 and 16 show embodiments of electrical connectors suitable for use to couple photovoltaic roofing elements together.
Figure 16:
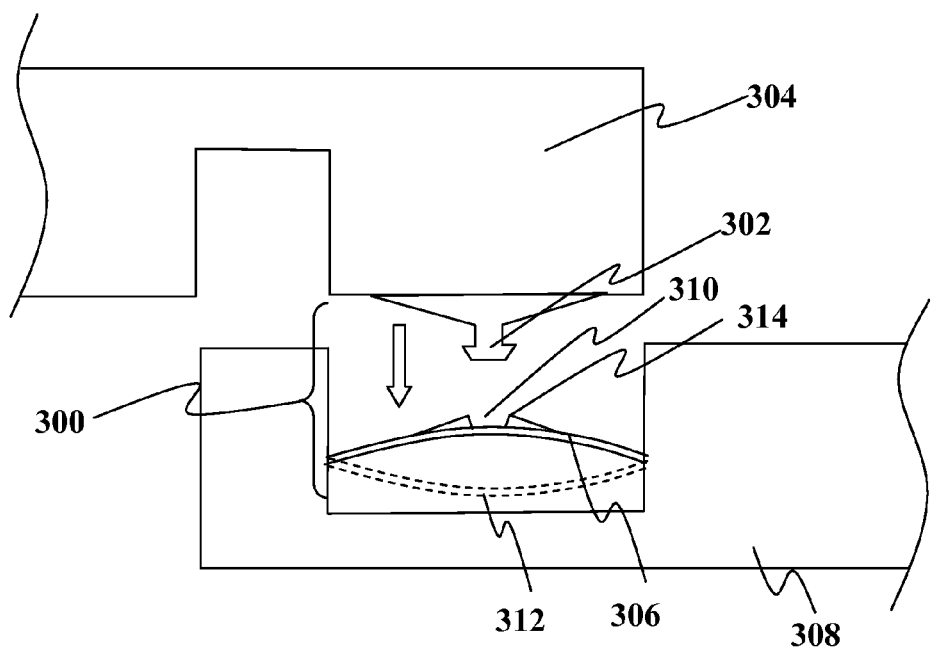

Referring now to FIGS. 15 and 16, one embodiment of electrical connectors between tiles will now be described. The installation of roof tiles is by itself a labor intensive undertaking. The use of convention solar shingles involves the participation of not only the roofer, but also an electrician or special solar module installer. The electrical connector 300 shown in FIG. 15 is designed to simplify the electrical connection of tile to tile and to integrate such connection as part of the motions and actions used by a roofer to install a non-solar roof tile. The present invention may provide an assembly process in which an electrician only needs to connect complete rows of tiles on the roof, not install each of them separately. This should minimize installation time and minimize the involvement of specialized electrical contractors.

FIG. 15 shows that a blade connector 302 that is coupled to one module in one tile 304 will be lowered to connect to an arched connector 306 in the receiving tile 308. The lowering of the tile 304 will cause the blade connector 302 to engage the arched connector 306. There is an opening 310 in the arched connector 306 for receiving the blade connector 302. As the blade connector advances downward, eventually, the arched connector will flip to a concave configuration as indicated in phantom by lines 312. This change in configuration will cause the flanges 314 to engage the blade connector 302 and provide mechanical hold on the connector 302. In some embodiments, the flanges 314 may be of hardness that it deforms part of the blade connector 302, creating a more solid interference fit. The change in orientation of connector 306 to the convex configuration 310 also engages a distal end 320 of the connector to an electrical lead 322 connected to the module. In this manner, the tiles are not electrically connected to its exposed connectors until the tile is set on the roof surface and engaged by an adjacent tile. This improves safety during installation.

FIG. 16 shows another embodiment wherein the connector 306 is connected electrically without the use of the pivoting distal end 320 shown FIG. 15. Although not limited to the following, the contacts desirably have tensile strength for use as a spring contact, high conductivity on the engaging surface and across distance, and corrosion resistance in humid and damp environments. The most likely material may be but is not limited to spring steel, which may be coated with copper or similar material for conductivity and then with nickel for corrosion resistance. Other options tested will be aluminum or brass with zinc or chrome as coatings. The contacts will be designed as a single stamped piece that at one end provides the connector, at the other end is soldered or spot-welded to the tabs exiting the solar laminate. The refined design will ensure a relative wiping motion between the connector surfaces on engagement to ensure abrasion of any slight corrosion or deposit during engagement, as well as a barb details to avoid disconnection when engaged.

The connector may be designed to have corrosion resistance over years of operation, secure electrical connection and use a design that does not require exact alignment are a must. Ease of use means a contact that ideally connects as the tiles are assembled on the roof in a standard fashion without requiring any additional step. A valuable feature will be the tactile and acoustic click-in feedback of the connection that permits a blind assembly of the connector. Safety means connectors safe to the touch during installation and use as well as in the case of damage and during rain. Low cost is desirable, as the desire for full mounting flexibility makes the ratio of connectors to cell surface for the chosen design much higher than in any other design.

Optionally, there may be generous guide-ins for large surface contacts. Registering surfaces outside the connector will be the stop in assembly to protect the actual connector surfaces which will be designed to slide relative to each other for potential deposit abrasion and will be compliant to take up tolerances. In addition, the connector will give clear acoustic and/or tactile feedback when engaged properly by means of its bi-stable contact surfaces. Optionally, the contact will only be live when it is in its engaged position. If the tolerance window of the tile proves too large for reliable connection, particularly due to imprecise positioning of tiles on a roof, two contact encasings per tile can be introduced that reduce the tolerance within the tile. Although not limited to the following, the contact casing may include plastic or similar material.

Figure 17:
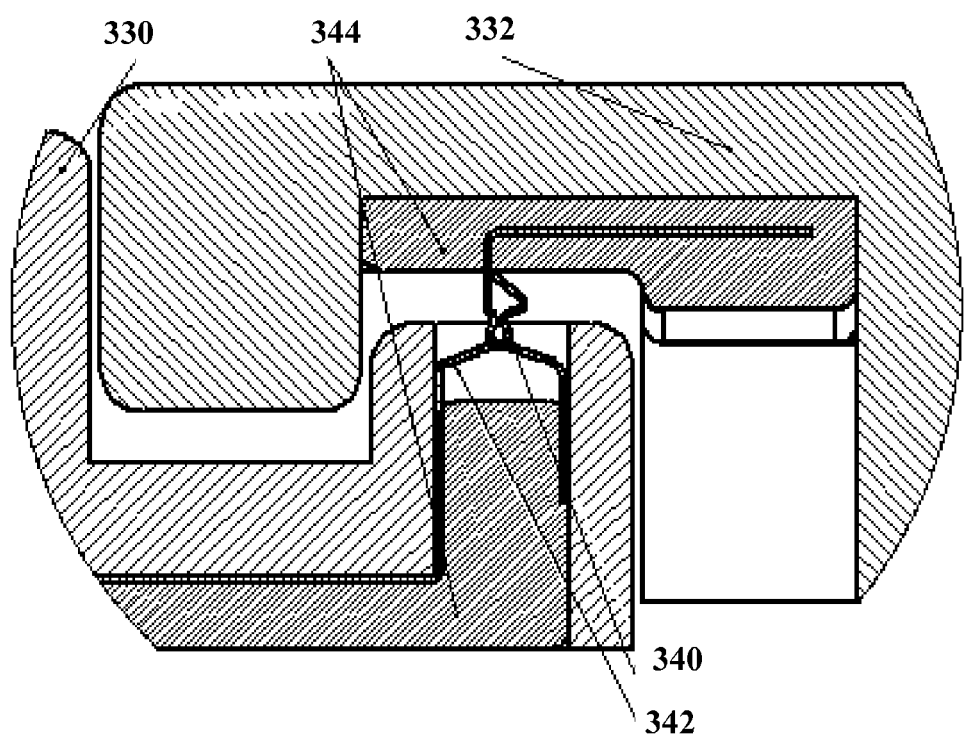
FIGS. 17 and 18 show embodiments of electrical connectors suitable for use to couple photovoltaic roofing elements together.
Figure 18:
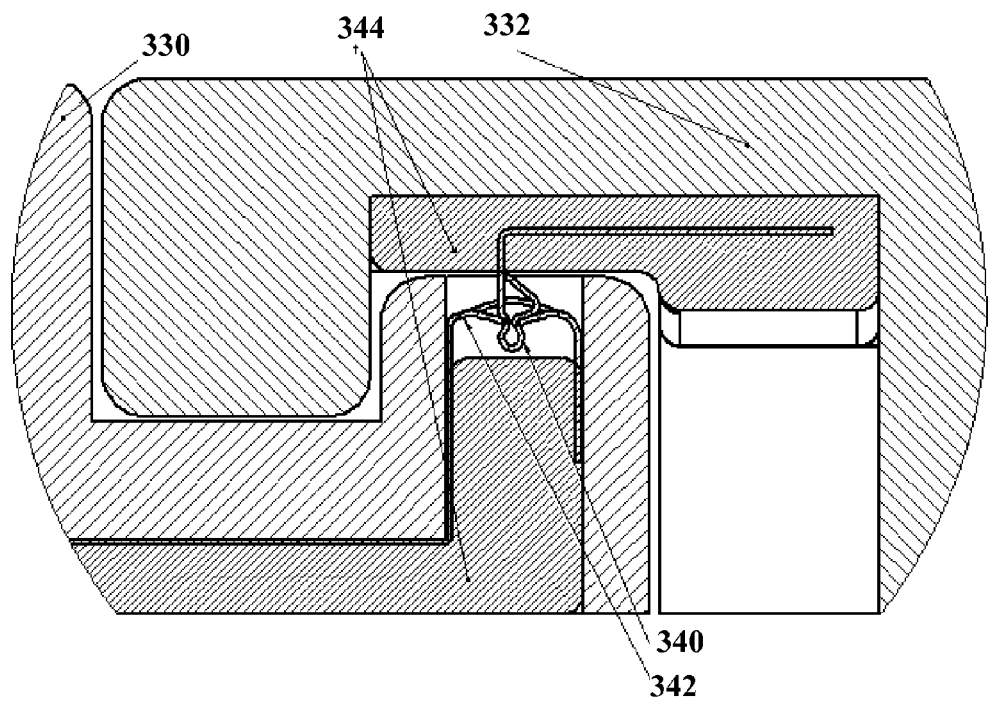

Referring now to FIGS. 17 and 18, yet another embodiment of the present invention for electrical connections will now be described. In this embodiment of FIG. 17, adjacent tiles 330 and 332 are about to be joined together. As will be described, no central junction box will be used. The connector 276 from one tile and connector 278 for the other tile are connected to their respective photovoltaic modules, similar to that shown for FIG. 13. Similar to the embodiments shown in FIGS. 15 and 16, the electrical connection is simultaneously made in the same action as that used to lay the tile in place. In this embodiment, the male interface 340 of connector 278 will pass through an opening defined by the female interface 342 that is used with connector 276. Potting material 344 is included in the tiles to hold the wire connectors 276 and 278 in place.

FIG. 18 shows that the downward motion of tile 332 will engage the flanges 350 and 352 that define an opening in the female interface 342. This causes the flanges to bend downward into a convex configuration and lock around the tip portion of the male interface. This mechanically holds the connection in place. There may also be some metal deformation to further improve the hold.

Figure 19:
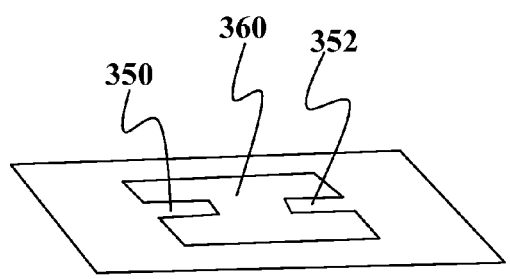
FIG. 19 shows a close-up view of a female interface for use in an electrical connector according to an embodiment of the present invention.

FIG. 19 shows a close-up view of the female interface 342 with the flanges 350 and 352. The male interface 340 will pass through the opening 356. This connector should automatically create an electrical contact when two neighboring solar tiles are installed next to each other. The contact will give affirmative feedback when the connection is made properly, enabling tile-to-tile installation by non-electricians. This connector system provides mechanical robustness, corrosion resistance, reliable electrical connection, and safe to the touch during installation. Cabling is reduced to the ends of each tile row, and together with the elimination of a junction box, this can be the lowest cost BIPV tile on the market.

Photovoltaic Module for Roofing Tile

Figure 20:
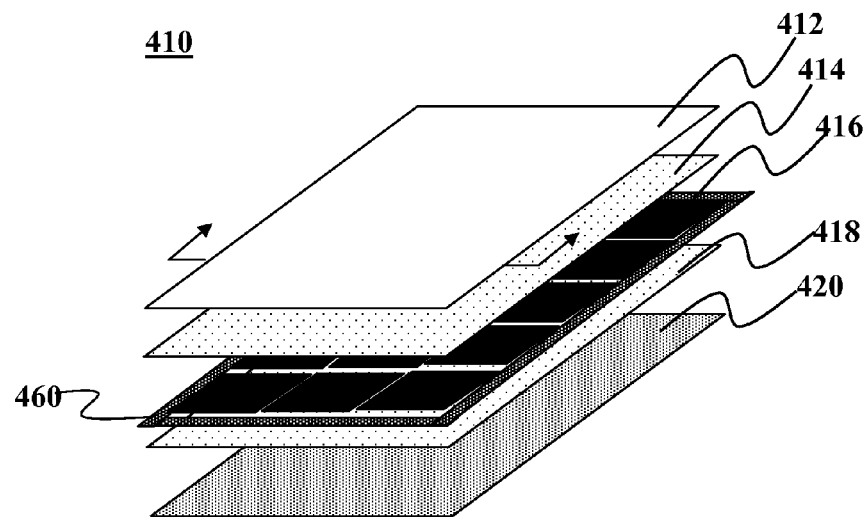
FIG. 20 shows an exploded perspective view of one embodiment of a module according to the present invention.

Referring now to FIG. 20, one embodiment of a module 410 according to the present invention will now be described. FIG. 20 shows that the present embodiment of module 410 may include a transparent module front layer 412 followed by a pottant layer 414, a plurality of solar cells 416, optionally a second pottant layer 418, and a module back layer 420. By way of nonlimiting example, the transparent front layer 412 may be a substantially transparent glass plate that provides structural support and acts as a protective barrier. The pottant layers 414 and 418 may be of the same or different pottant materials. Although the module 410 is designed for use with a glass-based module back layer 420, it should be understood that in some embodiments, the module back layer 420 may be a conductive metal foil that provides a low cost, light weight backside protective barrier for the solar cells 416 in the module 410. This type of module back layer eliminates the traditional back layer used in conventional modules which are either heavy such as glass, expensive such as Tedlar®/Aluminum/polyester/Tedlar® (TAPT) laminate, or both.

Referring still to FIG. 20, the various components of module 410 will be described in further detail. As seen in this embodiment, the module 410 may include a transparent front layer 412 that may be a glass plate comprised of one or more materials such as, but not limited to, conventional glass, float glass, solar glass, high-light transmission glass with low iron content, standard light transmission glass with standard iron content, anti-glare finish glass, anti-reflective finish, glass with a stippled surface, glass with a pyramidal surface, glass with textured surface, fully tempered glass, heat-strengthened glass, annealed glass, or combinations thereof. Module front layer 412 is not limited to any particular shape, and it may be rectangular, square, oval, circular, hexagonal, L-shaped, polygonal, other shapes, or combinations of any of the foregoing. The total thickness of the glass or multi-layer glass for layer 412 may be in the range of about 2.0 mm to about 13.0 mm, optionally from about 2.8 mm to about 12.0 mm. In another embodiment, the layer 412 has a total thickness of about 2.0 mm to 6.0 mm. In another embodiment, the layer 412 has a total thickness of about 3.0 mm to 5.0 mm. In yet another embodiment, the front layer 412 has a thickness of about 4.0 mm. It should be understood that in some embodiments, the transparent front layer 412 may be made of a non-glass material that provides a transparent rigid plate. Optionally, the front layer 412 whether it is glass or non-glass is substantially transparent in a spectral range from about 400 nm to about 1100 nm. Optionally, some embodiments of the present invention may have surface treatments applied to the glass such as but not limited to filters, anti-reflective layers, surface roughness, protective layers, moisture barriers, or the like. Although not limited to the following, the top layer is typically glass except those with anti-reflective finish which consists of one or more thin film layers applied to the glass.

Referring still to the embodiment of FIG. 20, the pottant layer 414 in module 410 may be any of a variety of pottant materials such as, but not limited to, ethyl vinyl acetate (EVA), polyvinyl butyral (PVB), ionomer, silicone, thermoplastic polyurethane (TPU), thermoplastic polyolefin (TPO), tetrafluoroethylene hexafluoropropylene vinylidene (THV), fluorinated ethylene-propylene (FEP), Tefzel® (ETFE), saturated rubber, butyl rubber, thermoplastic elastomer (TPE), flexibilized epoxy, epoxy, amorphous polyethylene terephthalate (PET), urethane acrylic, acrylic, other fluoroelastomers, other materials of similar qualities, or combinations thereof. The module 410 may have one or more pottant layers. Optionally, some embodiments of module 410 may have two or more pottant layers. The thickness of each pottant layer may be in the range of about 10 microns to about 1000 microns, optionally between about 25 microns to about 500 microns, and optionally between about 50 to about 250 microns. The module may use a layer of pottant that is thinner than about 200 microns. In one embodiment, the pottant layer 414 is about 100 microns in cross-sectional thickness. In another embodiment, the pottant layer 414 is about 50 microns in cross-sectional thickness. In yet another embodiment, the pottant layer 414 is about 25 microns in cross-sectional thickness.

In some embodiments where the module has two pottant layers, the second pottant layer 418 is about 100 microns in cross-sectional thickness. Optionally, the second pottant layer 418 is about 400 microns in cross-sectional thickness. Again, the thickness of the second pottant layer may be between the range of about 10 microns to about 1000 microns, optionally between about 25 microns to about 500 microns, and optionally between about 50 to about 250 microns. The pottant layers 414 and 418 may be of the same or different thicknesses. They may be of the same or different pottant material. Although not limited to the following, the pottant layers 414 or 418 may be solution coated over the cells or optionally applied as a sheet that is laid over cells under the transparent module layer 412. Further details about the pottant and other protective layers can be found in commonly assigned, co-pending U.S. patent application Ser. No. 11/462, 359 filed Aug. 3, 2006 and fully incorporated herein by reference for all purposes. It should be understood the highly heat transmitting pottant materials may also be used and further details on such materials can be found in commonly assigned, co-pending U.S. patent application Ser. No. 11/465, 783 filed Aug. 18, 2006 and fully incorporated herein by reference for all purposes.

It should be understood that the solar module 410 and any of the solar modules herein are not limited to any particular type of solar cell. The solar cells 416 may be silicon-based or non-silicon based solar cells. By way of nonlimiting example, the solar cells 416 may have absorber layers comprised of silicon (monocrystalline or polycrystalline), amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, Cu(In,Ga)(S,Se)$_2$, Cu(In,Ga,Al)(S,Se,Te)$_2$, and/or combinations of the above, where the active materials are present in any of several forms including but not limited to bulk materials, microparticles, nano-particles, or quantum dots. Advantageously, thin-film solar cells have a substantially reduced thickness as compared to silicon-based cells. The decreased thickness and concurrent reduction in weight allows thin-film cells to form modules that are significantly thinner than silicon-based cells without substantial reduction in structural integrity (for modules of similar design). The solar cells 416 may have various cross-sectional thicknesses. In one embodiment, it may be about 300 microns in cross-sectional thickness. Other cells may have thicknesses in the range of about 30 microns to about 1000 microns or optionally, 50 microns to about 500 microns.

Referring still to FIG. 20, to provide a reduced material cost and simplified module design, a module back layer 420 comprised of glass be may used. This creates a glass-glass module which has certain rigidity and moisture barrier properties.

Optionally, it should be understood that other materials may be used instead

Although not limited to the following, the foil may be a bare foil that forms the backside surface of the module without additional coatings on the expose foil surface. The module back layer 420 may be a conductive foil comprised of one or more of the following materials: aluminum, zinc-aluminum alloy coated steel (such as Galvalume®), Corrtan® steel (a controlled corrosion steel with an adherent oxide), tin-coated steel, chromium coated steel, nickel-coated steel, stainless steel, galvanized steel, copper, conductive-paint coated metal foil such as weather resistant polymer containing carbon fiber, graphite, carbon black, nickel fiber, nickel particles, combinations thereof, or their alloys. In one embodiment, the low cost module back layer 420 is an externally exposed aluminum foil. Although not limited to the following, the cross-sectional thickness of the aluminum foil may be between about 10 µm to about 1000 µm, optionally between about 50 µm and about 500 µm, or optionally between about 50 µm and about 200 µm. Such thicknesses may be desirable to provide for pinhole-free, cut-resistant, wrinkle-resistant performance. The use of a low cost, lightweight, corrosion resistant material is desirable to reduce cost and simplify module design.

Figure 21:
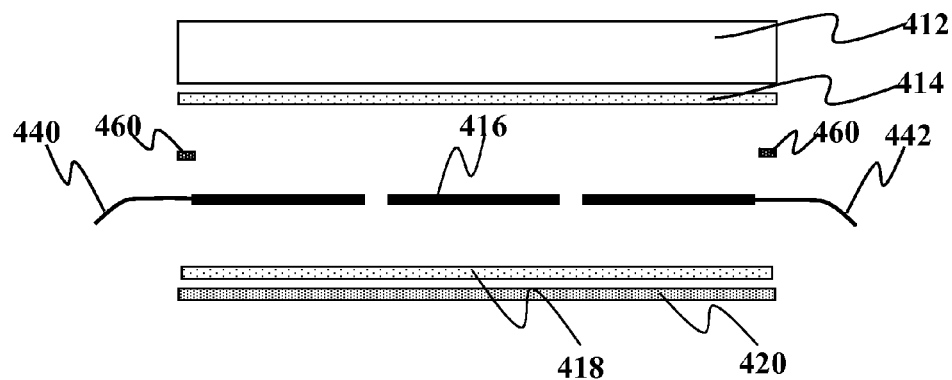
FIG. 21 shows a cross-sectional view of one embodiment of a module according to the present invention.

Referring still to FIG. 21, the present embodiment of module 410 shows a frameless module without a central junction box with electrical ribbons 440 and 442 for electrically coupling adjacent modules together. Although not limited to the following, the electrical lead wires/ribbons 440 and 442 may extend outward from between the module front layer 412 and the module back layer 420. These ribbons 440 and 442 are designed to exit along the sides of the module, between the various layers 412 and 420, rather than through them. This simplifies the issue of having to form openings in back layer or the front layer which may be an issue if the openings are improperly formed during such procedures. The electrical lead 442 may extend from one side of the cell 416 (either top or bottom) and not necessarily from the middle. The ribbon 40 may connect to a first cell in a series of electrically coupled cells and the ribbon 42 may connect to the last cell in the series of electrically coupled cells. The wires or ribbons 40 and 42 may optionally have a coating or layer to electrically insulate themselves from the backsheet 20. Optionally in some alternative embodiments, the wires or ribbons 40 and 42 may exit through an opening in the conductive metal foil layer (see FIG. 20). FIGS. 20 and 21 also show that a moisture barrier 460 may be positioned around the perimeter of the module. This barrier 460 may be at least partially enclosed by the module front layer 412 and module back layer 420. The barrier 460 may be comprised of a seal material alone or a seal material loaded with desiccant.

Optionally, it should also be understood that various other embodiments may also be suitable for use with the present invention. In one embodiment, the module may be a rigid module with a flexible, non-glass material for front layer 412 and a rigid material for back layer 420. In one embodiment, the back layer 420 may be a polycarbonate or other material with less weight than a comparable glass layer. This allows for roofing tile with decreased weight due to the lighter materials used for both the front layer 412 and the back layer 420.

By way of nonlimiting example, the flexible, non-glass material for front layer 412 may be a single layer or multiple layers. In one embodiment of the present invention, material for layer 412 may be a flexible material and have reasonable scratch resistance. Although not limited to the following, scratch resistance can be quantified by the ASTM D3363 pencil scratch test, where scratch resistance versus 1H, 2H, 3H, 4H, or harder pencil leads is desirable. The layer 412 may optionally have ultraviolet blocking ability to protect one or more layers below the layer 412 or the top layer in the protective barrier. As a nonlimiting example, the layer 412 may comprise of a co-polymer of ethylene and tetrafluoroethylene (ETFE), or silica-nanoparticle-filled, UV-resistance-additive-containing acrylic scratch resistant hard coat rated at 2H, 3H, or 4H pencil scratch resistance, or a weatherable silicone-based hard coat such as but not limited to GE Silicones UVHC8558, a UV-cured material comprising 1,6 hexanediol diacrylate; a GE trade secret type of silicone; and other GE proprietary ingredients, rated at less than 10% haze after 500 cycles of 500 g load, CS10F wheels, Taber Abrader. Haze is measured per ASTM D1003. The ETFE may be a modified ETFE (ethylene-tetrafluoroethylene) fluoropolymer such as Tefzel®. Tefzel® combines superior mechanical toughness with chemical inertness that approaches that of Teflon® fluoropolymer resins. Tefzel® features a specific gravity of about 1.7 and high-energy radiation resistance. Most grades are rated for continuous exposure at 150° C. (302° F.), based on a 20,000-hr criterion. In some embodiments, the layer 412 may include a notch filter layer to pass wavelengths that are a subset of light wavelengths. The layer may include a filter selected from one of the following to pass a desired set of light wavelengths: bandpass filter, high-pass filter, or low-pass filter. Optionally, the layer 412 may be used in conjunction with an anti-reflective layer above or below the layer 412.

Optionally, the layer 412 may include another layer of material that might provide one or more of the following: good adhesion; enhanced barrier properties to diffusion of water molecules or oxygen molecules; or enhanced ultraviolet resistance; or provide better light transmission by having an intermediate index of refraction that is between the index of refractions of layers above or below. As a nonlimiting example, this layer may be a difunctional molecular monolayer where one chemical functional group bonds well to the layer above and another chemical functional group bonds well to the layer below. In other embodiments of the invention, the layer may be a thin-film (nanofilm) of a barrier material such as but not limited to sputtered silicon dioxide ($SiO_2$), aluminum oxide ($Al_2O_3$), or other transparent oxide, a hybrid inorganic-organic barrier coating, such as GE ultra-high barrier coating which comprises silicon oxides, nitrides, and organic Si containing plasma polymer with nondiscrete interfaces marketed for organic light emitting displays (OLEDs).

Optionally, the layer 412 may be a thermoplastic polyurethane, a thermosetting ethylene vinyl acetate (EVA), a thermoplastic fluoropolymer such as a copolymer of tetrafluoroethylene, hexafluoropropylene and vinylidene fluoride (THV), a silicone based material, and/or a thermoplastic ionomer resin such as but not limited to DuPont Surlyn®. In one embodiment, the layer 412 comprises of a thermoplastic polyurethane such as but not limited to Desmopan® aliphatic ester thermoplastic polyurethane from Bayer or Dureflex® A4700 aliphatic ether thermoplastic polyurethane from Deerfield Urethane. In one embodiment, the layer 412 thickness is optionally between 10 microns and 1000 microns, more optionally between 10 microns and 500 microns, and optionally between 100 and 300 microns.

It should be understood that the front layer 412 may include one, two, three or more layers of any of the foregoing materials. Each layer may be comprised of the same or different material.

Optionally, in a different embodiment of the present invention, the front layer 412 may be a rigid material a flexible material may be used for the back layer 420. One embodiment may use an opaque or nonopaque version of the materials previously listed for front layer 412. In one nonlimiting example, layer 420 may be selected from the following example conventional back sheets: Tedlar-polyester-Tedlar (TPT), Tedlar-polyester (TP), Tedlar-aluminum-polyester (TAP), Tedlar-aluminum-polyester-Tedlar (TAPT), Tedlar-aluminum-polyester-EVA (TAPE). These conventional back sheets also contain adhesive tie layers and adhesion-promoting surface treatments that are proprietary to the back sheet vendors. Conventional back sheets are available from Isovolta of Austria and Madico of USA. Layer 420 may optionally be selected from the following example unconventional back sheets: aluminum sheet; steel; stainless steel; galvanized steel; Galvalume® 55% aluminum-zinc alloy coated sheet steel; conversion-coated steel such as chromate-based, phosphate-based, or similar corrosion-resistant coated sheet steel; plasticized or unplasticized polyvinylchloride (PVC) formulations; aliphatic ether or aliphatic ester or aromatic ether or aromatic ester thermoplastic polyurethanes; ethylene-propylene-diene (EPDM) rubber sheet; thermoplastic polyolefin (TPO) sheet, polypropylene sheet, polyethylene sheet, polycarbonate sheet, acrylic sheet, and/or single or multiple combinations thereof.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, although glass is the layer most often described as the top layer for the module, it should be understood that other material may be used and some multi-laminate materials may be used in place of or in combination with the glass. Some embodiments may use flexible top layers or coversheets. There may be anti-reflective or other surface treatments of the top layer. By way of nonlimiting example, the backsheet is not limited to rigid modules and may be adapted for use with flexible solar modules and flexible photovoltaic building materials. Embodiments of the present invention may be adapted for use with superstrate or substrate designs. Details of modules with thermally conductive backplanes and heat sinks can be found in commonly assigned, co-pending U.S. patent application Ser. No. 11/465,783 filed Aug. 18, 2006 and fully incorporated herein by reference for all purposes. The pottant material may be made more thermally conductive based on techniques shown in U.S. patent application Ser. No. 11/465,783. The use of a conductive foil also provides a module back layer with sufficiently high thermally conductivity to improve heat transfer out of the module. Other backsheet materials may also be used and is not limited to glass only embodiments. The housing of the connector could be made of any material by any method. The connector could be designed for hand assembly instead of automated assembly, leaving out locating features. The connector could be designed without the channel and holes to allow potting. The connector could be designed to allow two or more connectors to exit the solar module, and could include diode linked between the exiting conductors. In one embodiment, both electrical leads or edge connectors are on the same side of module. In another embodiment, they are on different sides. In a still further embodiment, they are diagonal from each other. In yet another embodiment, they are on opposing sides. Optionally, in such a configuration, the top sheet 412 may be a flexible top sheet such as that set forth in U.S. Patent Application Ser. No. 60/806,096 filed Jun. 28, 2006 and fully incorporated herein by reference for all purposes. It should also be understood that embodiments of the present invention may also be used with a central junction box and are not limited to only edge exiting electrical connectors. The modules may be mounted in either landscape or portrait orientation, with edge connectors located as appropriate to minimize distance to the closes adjacent module. It should also be understood that some embodiments of the module may have no pottant layers.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, Cu(In,Ga)(S,Se)$_2$, Cu(In,Ga,Al)(S,Se,Te)$_2$, and/or combinations of the above, where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or C$_{60}$ molecules, and/or other small molecules, microcrystalline silicon cell architecture, randomly placed nano-rods and/or tetrapods of inorganic materials dispersed in an organic matrix, quantum dot-based cells, or combinations of the above. Many of these types of cells can be fabricated on flexible substrates, including other non-CIGS thin-film solar cells.

Although the cells as shown as being planar in shape, those of round, tubular, rod or other shapes are not excluded. Some embodiments may also use internal reflectors positioned between cells to improve light collection. Some embodiment may have the cells formed directly on a glass surface of the module without an encapsulant layer between one layer of the glass and the cell.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A photovoltaic roofing structure comprising:
   a first roofing tile having a first open center portion and a substantially planar configuration;
   a first photovoltaic module positioned over the first open center portion;
   a second roofing tile adjacent the first roofing tile, wherein the second roofing tile includes a second open center portion and a substantially planar configuration,
   a second photovoltaic module positioned over the second open center portion;
   wherein the first roofing tile is configured to create an overlap with a portion of the second roofing tile to define a covered air circulation pathway between an underside of the first photovoltaic module through the first open center portion and an underside of the second photovoltaic module through the second open center portion, wherein at a junction between tiles, the air circulation pathway is covered by the overlap and permits direct air contact on the underside.

2. The photovoltaic roofing structure of claim 1 wherein a ratio of the weight of the tile to the weight of the module greater than 10:1, wherein the combination of the module and tile weighs less than a conventional roofing tile of the external volume and surface area.

3. The photovoltaic roofing structure of claim 1 wherein the first roofing tile comprises ceramic.

4. The photovoltaic roofing structure of claim 1 wherein electrical leads from the module exit from between layers of the module without passing through a central junction box.

5. The photovoltaic roofing structure of claim 1 wherein the module is a glass-glass module.

6. The photovoltaic roofing structure of claim 1 wherein the module is a glass-foil module.

7. The photovoltaic roofing structure of claim 1 wherein the module contains thin-film solar cells.

8. The photovoltaic roofing structure of claim 1 wherein the module contains solar cells based on a group IB-IIIA-VIA absorber layer.

9. The photovoltaic roofing structure of claim 1 further comprising a polymer material between the first roofing tile and the module to minimize changes.

10. The photovoltaic roofing structure of claim 1 further comprising using a coupler to manage CTE differences between the module and the first roofing tile.

11. The photovoltaic roofing structure of claim 1 wherein the first roofing tile defines an opening passing entirely through the tile, over which the module is placed.

12. The photovoltaic roofing structure of claim 1 wherein the first roofing tile defines a carrier frame with an open center that is covered by the photovoltaic module.

13. The photovoltaic roofing structure of claim 1 further comprising a ventilation channel to dissipate heat from beneath the module.

14. The photovoltaic roofing structure of claim 1 further comprising a ventilation channel is defined between a bottom surface of the module and a portion of the surface of the first roofing tile.

15. The photovoltaic roofing structure of claim 1 further comprising a press-fit electrical connector to create serial interconnection between tiles.

16. The photovoltaic roofing structure of claim 1 wherein the surface area of the module can almost be completely covered by active cells.

* * * * *